United States Patent
Hung et al.

(10) Patent No.: US 8,456,234 B2
(45) Date of Patent: Jun. 4, 2013

(54) BIAS CURRENT CONTROL METHOD AND DRIVING CIRCUIT FOR OPERATIONAL AMPLIFIER

(75) Inventors: Wei-Hsiang Hung, Hsinchu (TW); Chia-Hung Lin, Hsinchu (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 61 days.

(21) Appl. No.: 13/152,256

(22) Filed: Jun. 2, 2011

(65) Prior Publication Data

US 2012/0161866 A1      Jun. 28, 2012

(30) Foreign Application Priority Data

Dec. 27, 2010   (TW) ................................ 99146074 A

(51) Int. Cl.
*H03G 3/20*       (2006.01)
*H03F 3/45*       (2006.01)

(52) U.S. Cl.
USPC ............................................ 330/127; 330/261

(58) Field of Classification Search
USPC ......................................... 330/127, 136, 261
See application file for complete search history.

(56) References Cited

U.S. PATENT DOCUMENTS

2011/0050677 A1*   3/2011   Tsai et al. ..................... 345/213

* cited by examiner

*Primary Examiner* — Robert Pascal
*Assistant Examiner* — Khiem Nguyen
(74) *Attorney, Agent, or Firm* — Winston Hsu; Scott Margo

(57) ABSTRACT

A bias current control method for an operational amplifier is disclosed, which includes detecting a slew rate operating signal, determining signal period length of the slew rate operating signal to generate a determination signal, and generating a high bias modulation signal or a low bias modulation signal to the operational amplifier according to the determination signal and the slew rate operating signal.

12 Claims, 5 Drawing Sheets

BIAS CURRENT CONTROL METHOD AND DRIVING CIRCUIT FOR OPERATIONAL AMPLIFIER

BACKGROUND OF THE INVENTION

1. Field of the Invention

The present invention relates to a bias current control method and related driving circuit, and more particularly, to a bias current control method capable of reducing power consumption and enhancing slew rate for realizing optimal system performance and related driving circuit.

2. Description of the Prior Art

An operational amplifier is a widely used element for realizing a variety of circuit functions. Take driving circuits of a liquid crystal display (LCD) for example, the operational amplifier can be used as an output buffer, which charges or discharges loading ends, i.e. liquid crystals, according to analog signals outputted by a front stage digital-to-analog converter, for driving corresponding pixel units on the LCD. However, with increases in size and resolution of the LCD, data quantity processed by the driving circuits per unit of time is also increasing significantly, so that response speed of the operational amplifier, also called slew rate, has to be enhanced as well.

The operational amplifier generally has a two-stage structure, which includes an input stage and an output stage circuit. The input stage circuit is utilized for increasing gain of the operational amplifier, while the output stage circuit is utilized for driving capacitive or resistive loads connected to the operational amplifier. In addition, since the operational amplifier may suffer loop instability problems, Miller compensation capacitors are commonly implemented to perform frequency compensation for improving loop stability. In the prior art, when the operational amplifier drives a load, the slew rate is often restricted by the bias current of the input stage circuit. In detail, the response speed (slew rate) of the operational amplifier is decided by the bias current of the input stage circuit and the driving capability of the output stage circuit. In this situation, the response speed (slew rate) of the operational amplifier can be expressed by the following slew rate equation:

$$SR = \frac{I}{C} = \frac{\Delta V}{t},$$

in which "I" indicates a bias current, "C" indicates capacitance of the internal capacitors, and "$\Delta V$" indicates voltage variation of the output voltage of the operational amplifier. This means that the response speed of the operational amplifier is decided by the charging (or discharging) speed when the internal capacitor of the operational amplifier is charged (or discharged) by the bias current of the input stage circuit. As can be seen from the above, when the bias current of the input stage circuit increases, the internal capacitors can be charged or discharged much faster, so that the response speed of the operational amplifier can be enhanced as well. In short, the internal slew rate of the operational amplifier is generally enhanced by increasing the bias current of the input stage circuit so as to increase the driving speed of the operational amplifier.

For example, please refer to FIG. 1, which is a schematic diagram of a driving circuit 10 with slew rate enhancement function according to the prior art. The driving circuit 10 includes an operational amplifier 102 and a bias current control unit 104. The operational amplifier 102 is utilized for generating an output voltage VO to a load LOAD according to an input voltage VI. The bias current control unit 104 is utilized for controlling a bias current of the operational amplifier 102 to enhance internal slew rate of the operational amplifier 102. Generally, the prior art increase a bias current I of the operational amplifier 102 by the bias current control unit 104 to enhance the internal slew rate of the operational amplifier 102 before the operational amplifier 102 begins to drive the load LOAD. Thus, the operational amplifier 102 would have enough driving capability to drive the load LOAD, i.e. charge (or discharge) the load LOAD. Please refer to FIG. 2. FIG. 2 is a schematic diagram of related signal waveforms of the driving circuit 10 shown in FIG. 1. A load input signal LD is utilized for indicating when to driving the load LOAD. Suppose the operational amplifier 102 will begin to charge or discharge the load LOAD on the falling edge of the load input signal LD. In this situation, the slew rate enhancement process should be finished before the falling edge of the load input signal LD. As shown in FIG. 2, during the period T1, the bias current control unit 104 controls the bias current of the operational amplifier 102 to keep at a high current level for increasing the slew rate. During period T2, since the slew rate has been enhanced, the bias current control unit 104 further controls the bias current of the operational amplifier 102 to keep at a normal operation level. During the period T3, the output voltage VO rises to a driving level shown in FIG. 2. However, during the period T2, i.e. from the time the required slew rate of the operational amplifier 102 has been enhanced until the operational amplifier 102 begins driving the load LOAD, since the operational amplifier 102 does not need to perform any operation, the provided bias current may cause additional power consumption.

SUMMARY OF THE INVENTION

It is therefore an objective of the present invention to provide a bias current control method and driving circuit.

The present invention discloses a bias current control method for an operational amplifier, which includes detecting a slew rate operating signal; determining signal period length of the slew rate operating signal to generate a determination signal; and generating a high bias modulation signal or a low bias modulation signal to the operational amplifier according to the determination signal and the slew rate operating signal.

The present invention further discloses a driving circuit, which includes an operational amplifier; a detection unit for detecting a slew rate operating signal and determining signal period length of the slew rate operating signal to generate a determination signal; and a bias current control unit for generating a high bias modulation signal or a low bias modulation signal to the operational amplifier according to the determination signal and the slew rate operating signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
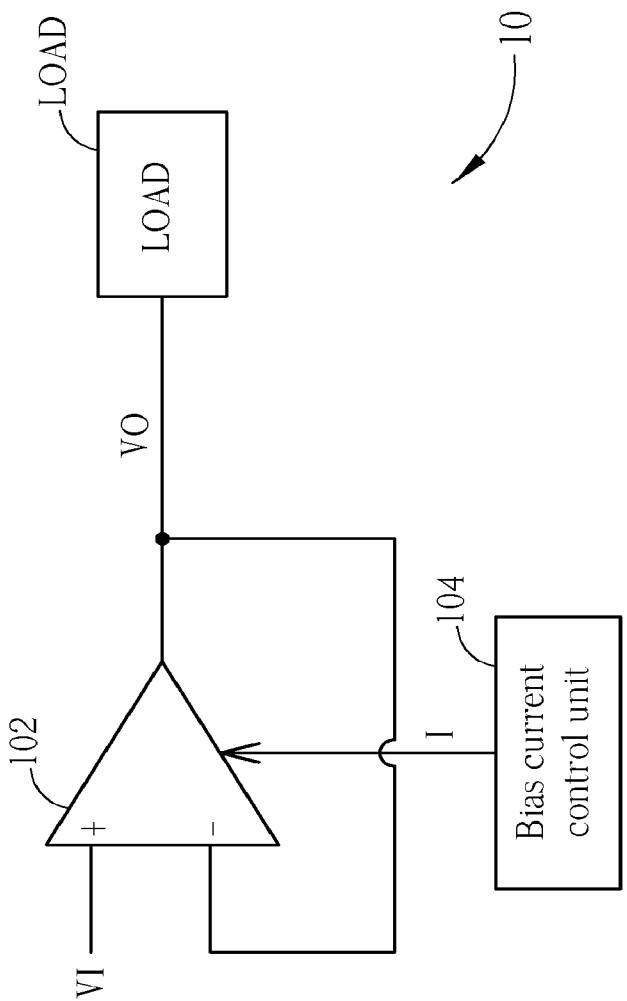
FIG. 1 is a schematic diagram of a driving circuit with slew rate enhancement function according to the prior art.
Figure 2:
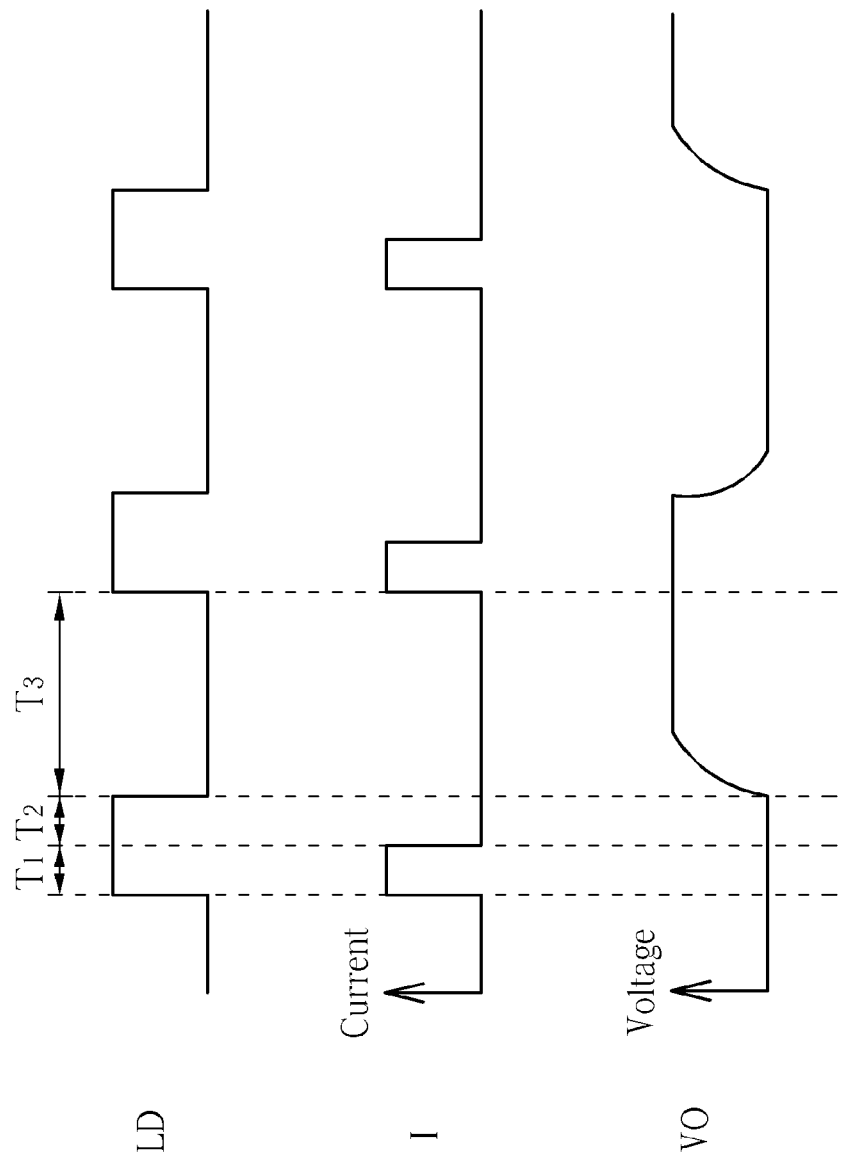
FIG. 2 is a schematic diagram of signal waveforms of the driving circuit shown in FIG. 1.
Figure 3:
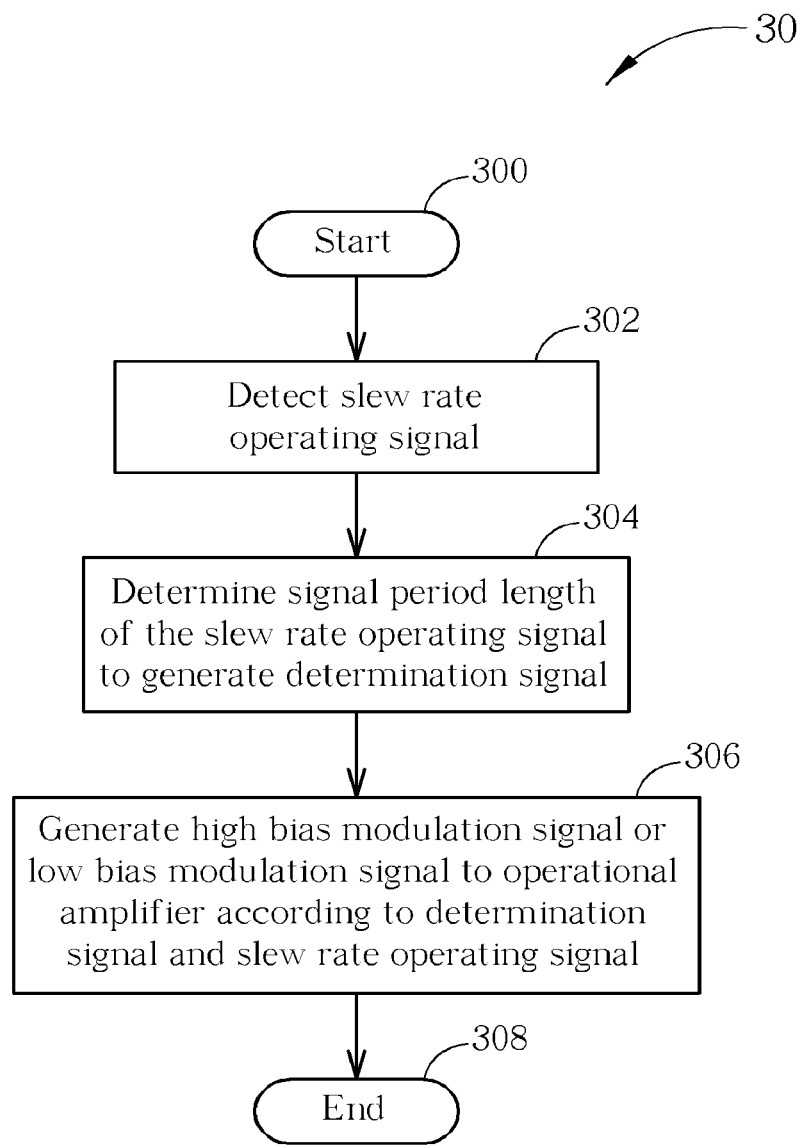
FIG. 3 is a schematic diagram of a bias current control procedure for an operational amplifier according to an embodiment of the present invention.

Please refer to FIG. 3 which is a schematic diagram of a bias current control procedure 30 for an operational amplifier according to an embodiment of the present invention. The procedure 30 includes the following steps:

Step 300: Start.

Step 302: Detect slew rate operating signal.

Step 304: Determine signal period length of the slew rate operating signal to generate determination signal.

Step 306: Generate high bias modulation signal or low bias modulation signal to operational amplifier according to determination signal and slew rate operating signal.

Step 308: End.

According to the procedure 30, the present invention can determine signal period length of the detected slew rate operating signal and generate the corresponding determination signal accordingly before the operational amplifier starts driving the external load. Moreover, the high bias modulation signal is generated to the operational amplifier according to the determination signal during the signal period of the slew rate operating signal so that the slew rate of the operational amplifier is increased adequately before the operational amplifier starts driving the external load. After that, the low bias modulation signal is generated to the operational amplifier so as to reduce power consumption of the operational amplifier. As a result, through the operation of the procedure 30, the present invention can respectively provide the corresponding high bias modulation signal and the low bias modulation signal to the operational amplifier according to the determination signal. Therefore, the present invention can not only enhance the internal slew rate of the operational amplifier, but also reduce the power consumption of whole system before driving the load.

Figure 4:
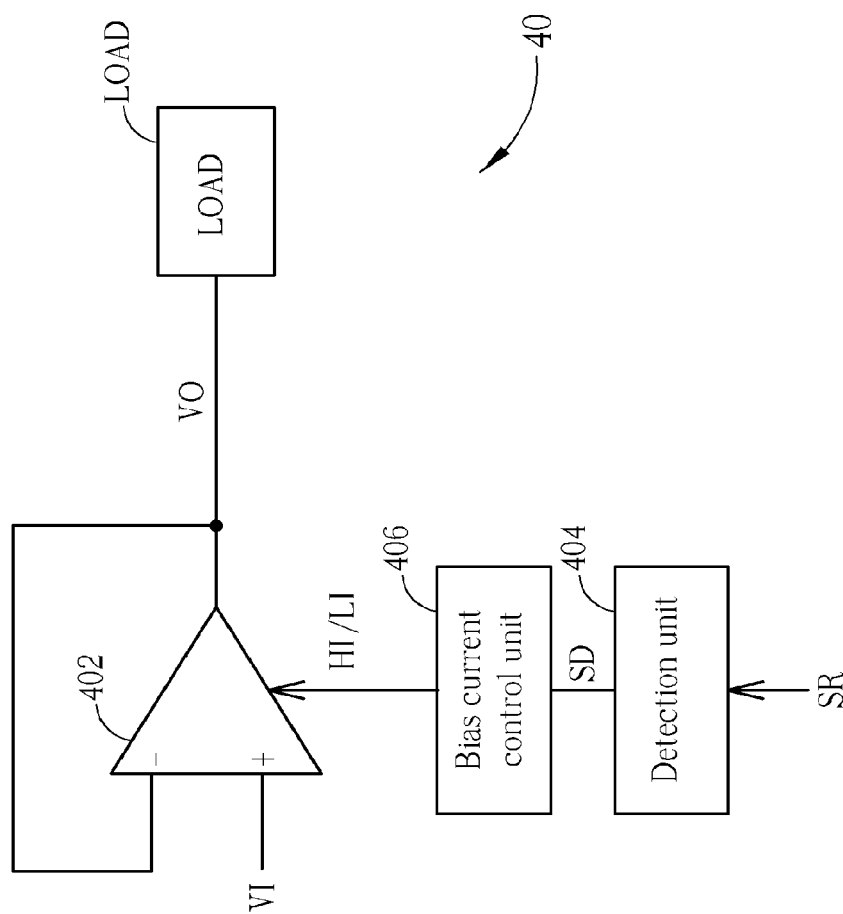
FIG. 4 is a schematic diagram of a driving circuit according to an embodiment of the present invention.

Please refer to FIG. 4. FIG. 4 is a schematic diagram of a driving circuit 40 according to an embodiment of the present invention. The driving circuit 40 is utilized for implementing the procedure 30, which includes an operational amplifier 402, a detection unit 404, and a bias current control unit 406. The operational amplifier 402 is utilized for generating an output voltage VO to a load LOAD according to an input voltage VI. The detection unit 404 is utilized for detecting a slew rate operating signal SR and determining signal period length of the slew rate operating signal SR to generate a determination signal SD. During a signal period of the slew rate operating signal SR, the bias current control unit 406 generates a high bias modulation signal HI or a low bias modulation signal LI to the operational amplifier 402 according to the determination signal SD. In brief, the bias current control unit 406 generates the high bias modulation signal HI to the operational amplifier 402 for increasing the bias current of the operational amplifier 402 and the internal slew rate of the operational amplifier 402 is increased to the desired value accordingly. Moreover, during the signal period of the slew rate operating signal SR, since the operational amplifier 402 usually does not perform any operation after the internal slew rate has been enhanced, the bias current control unit 406 can generate the low bias modulation signal LI to the operational amplifier 402. Therefore, the bias current of the operational amplifier 102 can be reduced without consuming additional energy before the operational amplifier 102 begins driving the load LOAD, achieving more effective power saving.

In the embodiment, a current of the high bias modulation signal HI is preferably higher than the bias current of the operational amplifier 402 in the normal operation. Similarly, a current of the low bias modulation signal LI is lower than the bias current of the operational amplifier 402 in the normal operation. Therefore, when the high bias modulation signal HI is provided to the operational amplifier 402, the slew rate of the operational amplifier 402 can be increased. When the low bias modulation signal LI is provided to the operational amplifier 402, the low bias modulation signal LI will not affect the operation of the operational amplifier 402 having no operation requirement, and the system power consumption is reduced accordingly. For achieving the required slew rate of the operational amplifier 402, a current of the high bias modulation signal HI can be set to be higher than the bias current of the operational amplifier 402 in the normal operation, and furthermore, frequency and signal period of the high bias modulation signal HI can also be varied according to system requirements, such as the driving timing to drive the load LOAD for the operational amplifier 402, etc.

On the other hand, the slew rate operating signal SR can be regarded as an indication signal for slew rate enhancement. For example, the slew rate operating signal SR can be generated before the beginning of a load input signal LD. Thus, during the signal period of the slew rate operating signal SR, the bias current control unit 406 can realize slew rate enhancement process for the operational amplifier 402 so that the operational amplifier 402 would have enough driving capability before driving the load LOAD. For example, the bias current control unit 406 can sequentially generate the high bias modulation signal and the low bias modulation signal to the operational amplifier according to the determination signal and the slew rate operating signal during the signal period of the slew rate operating signal according to the determination signal and the slew rate operating signal. In a preferred embodiment, as the sum of the signal period of the high bias modulation signal HI and the signal period of the low bias modulation signal LI is equal to the signal period of the slew rate operating signal SR. this means the driving circuit 40 can arrange sufficient driving capability before driving the load LOAD and also save unnecessary power consumption effectively by full utilizing the signal period of the slew rate operating signal SR, so as to achieving optimal system performance. Besides, the sum of the signal period of the high bias modulation signal HI and the signal period of the low bias modulation signal LI can also be longer or shorter than the signal period of the slew rate operating signal SR.

In addition, when the determination signal SD indicates signal period of the slew rate operating signal SR is shorter than signal period of the high bias modulation signal Hi, the bias current control unit 406 can generate the high bias modulation signal HI and the low bias modulation signal LI to the operational amplifier 402. When the determination signal indicates the signal period of the slew rate operating signal is longer than the signal period of the high bias modulation signal, the bias current control unit 406 can only generate the high bias modulation signal HI to the operational amplifier 402.

Figure 5:
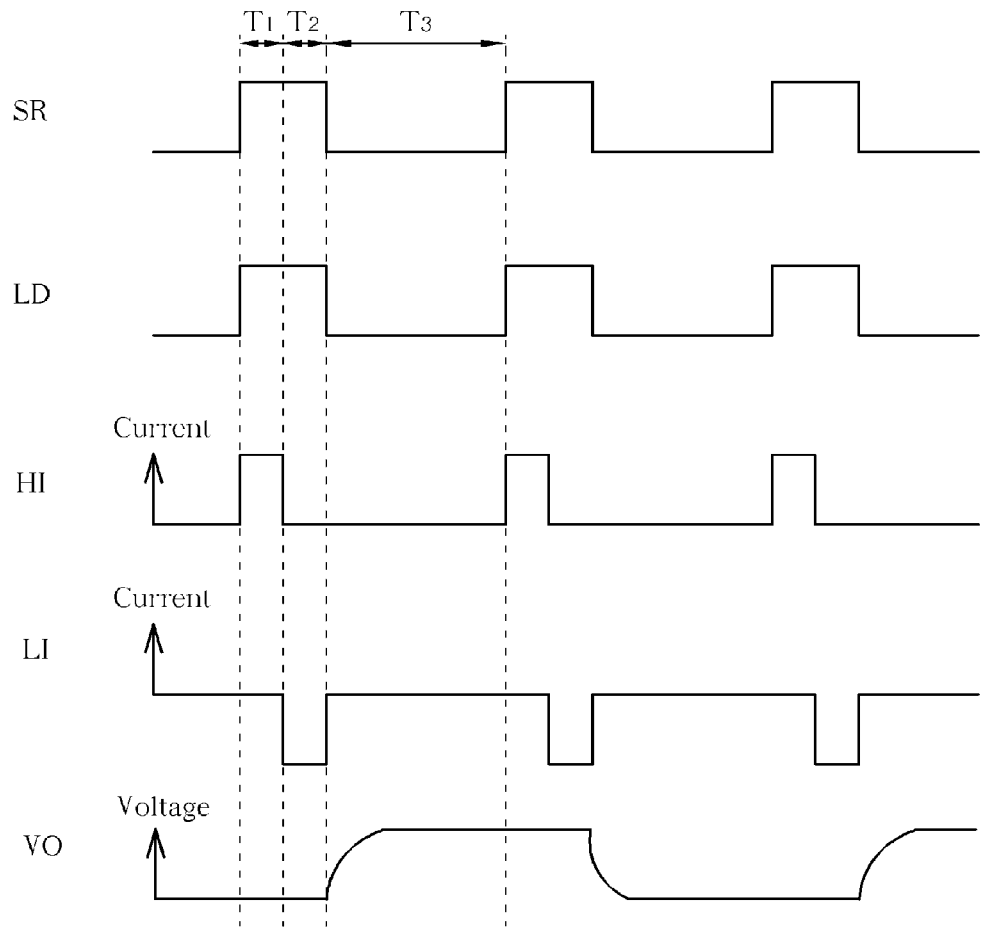
FIG. 5 is a schematic diagram of related signal waveforms of the driving circuit shown in FIG. 4 according to an embodiment of the present invention.

Further description associated with the operation of the driving circuit 40 is provided as follows. Please refer to FIG. 5, which is a schematic diagram of related signal waveforms of the driving circuit 40 shown in FIG. 4 according to an embodiment of the present invention. Suppose the driving circuit 40 is applied in an LCD for driving liquid crystal pixels. In such a situation, the load LOAD represents the liquid crystal pixels (capacitive loads). As shown in FIG. 5, a load input signal LD is a periodical pulse signal. When the load input signal LD is at a low level, the operational amplifier 102 charges (or discharges) the load LOAD. Similarly, when the load input signal LD is at a high level, the operational amplifier 102 does not charge (or discharge) the load LOAD. In the embodiment, the load input signal LD during the high level can be used as the slew rate operating signal SR. This means the load input signal LD during the period T1 and T2 can be regarded as the slew rate operating signal SR. In such a condition, the detection unit 404 detects the slew rate operating signal SR, and then determines signal period length of the slew rate operating signal SR to generate a determination signal SD accordingly. Furthermore, during the period T1, the bias current control unit 406 generates the high bias modulation signal HI to the operational amplifier 402 according to the determination signal SD, and the slew rate of the driving circuit 40 is increased enough for driving the load LOAd. During the period T2, the bias current control unit 406 generates the low bias modulation signal LI to the operational amplifier 402 according to the determination signal SD. Therefore, the driving circuit 40 would consume the least energy during the period T2. During the period T3, the output voltage VO can rises to a desired level in the shortest time due to sufficient driving capability.

In summary, the invention is capable of dynamically adjusting the bias current of the operational amplifier according to system requirements. The invention can enhance the internal slew rate of the operational amplifier opportunely before charging or discharging external load and provide a low bias current in the remain waiting time to reduce system power consumption. In other words, the invention can offer the operational amplifier to have sufficient driving capability before driving the external load and further save unnecessary power consumption effectively for achieving optimal system performance.

Those skilled in the art will readily observe that numerous modifications and alterations of the device and method may be made while retaining the teachings of the invention.

What is claimed is:

1. A bias current control method for an operational amplifier, comprising:
    detecting a slew rate operating signal, wherein the slew rate operating signal is generated before a load input signal is activated;
    determining signal period length of the slew rate operating signal to generate a determination signal; and
    sequentially generating a high bias modulation signal and a low bias modulation signal to the operational amplifier according to the determination signal and the slew rate operating signal during a signal period of the slew rate operating signal.

2. The bias current control method of claim 1, wherein the step of generating the high bias modulation signal or the low bias modulation signal to the operational amplifier according to the determination signal and the slew rate operating signal comprises:
    generating the high bias modulation signal and the low bias modulation signal to the operational amplifier during a signal period of the slew rate operating signal when the determination signal indicates the signal period of the slew rate operating signal is shorter than the signal period of the high bias modulation signal.

3. The bias current control method of claim 1 further comprising only generating the high bias modulation signal to the operational amplifier during a signal period of the slew rate operating signal when the determination signal indicates the signal period of the slew rate operating signal is longer than the signal period of the high bias modulation signal.

4. The bias current control method of claim 1, wherein the sum of the signal period of the high bias modulation signal and the signal period of the low bias modulation signal is equal to the signal period of the slew rate operating signal.

5. The bias current control method of claim 1, wherein the end of the slew rate operating signal is the beginning of the load input signal.

6. The bias current control method of claim 1, wherein a current of the high bias modulation signal is higher than the bias current of the operational amplifier in a normal operation, and a current of the low bias modulation signal is lower than the bias current of the operational amplifier operating in the normal operation.

7. A driving circuit, comprising:
    an operational amplifier;
    a detection unit for detecting a slew rate operating signal and determining signal period length of the slew rate operating signal to generate a determination signal, wherein the slew rate operating signal is generated before a load input signal is activated; and
    a bias current control unit for sequentially generating a high bias modulation signal and a low bias modulation signal to the operational amplifier according to the determination signal and the slew rate operating signal during a signal period of the slew rate operating signal.

8. The driving circuit of claim 7, wherein the bias current control unit generates the high bias modulation signal and the low bias modulation signal to the operational amplifier during a signal period of the slew rate operating signal when the determination signal indicates the signal period of the slew rate operating signal is shorter than the signal period of the high bias modulation signal.

9. The driving circuit of claim 7, wherein the bias current control unit only generates the high bias modulation signal to the operational amplifier during a signal period of the slew rate operating signal when the determination signal indicates the signal period of the slew rate operating signal is longer than the signal period of the high bias modulation signal.

10. The driving circuit of claim 7, wherein the sum of the signal period of the high bias modulation signal and the signal period of the low bias modulation signal is equal to the signal period of the slew rate operating signal.

11. The driving circuit of claim 7, wherein the end of the slew rate operating signal is the beginning of the load input signal.

12. The driving circuit of claim 7, wherein a current of the high bias modulation signal is higher than the bias current of the operational amplifier in a normal operation, and a current of the low bias modulation signal is lower than the bias current of the operational amplifier operating in the normal operation.

* * * * *